United States Patent [19]
Ashar et al.

[11] Patent Number: 5,522,063
[45] Date of Patent: May 28, 1996

[54] METHOD OF FINDING MINIMUM-COST FEEDBACK-VERTEX SETS FOR A GRAPH FOR PARTIAL SCAN TESTING WITHOUT EXHAUSTIVE CYCLE ENUMERATION

[75] Inventors: Pranav N. Ashar; Sharad Malik, both of Princeton, N.J.

[73] Assignee: NEC USA, Inc., Princeton, N.J.

[21] Appl. No.: 127,681

[22] Filed: Sep. 27, 1993

[51] Int. Cl.$^6$ ................................................ G06F 15/00
[52] U.S. Cl. ..................... 395/500; 364/488; 371/22.3
[58] Field of Search .................................. 364/490, 491, 364/488; 395/578, 500; 371/21.3, 21.5, 22.2, 22.3, 22.5, 22.6, 25.1

[56] References Cited

U.S. PATENT DOCUMENTS

| | | | |
|---|---|---|---|
| 4,493,077 | 1/1985 | Agrawal et al. | 371/25.1 |
| 4,872,169 | 10/1989 | Whetsel, Jr. | 371/22.3 |
| 4,894,830 | 1/1990 | Kawai | 371/22.3 |
| 5,043,986 | 8/1991 | Agrawal et al. | 371/25.1 |
| 5,434,794 | 7/1995 | Coudert et al. | 364/489 |

OTHER PUBLICATIONS

Bryant, "Graph-Based Algorithms for Boolean Function Manipulation", IEEE 1986, pp. 677–691.
Madre et al., "Automating the Diagnosis and the Rectification of Design Error with PRIAM", IEEE 1989, pp. 30–33.
Mailhot et al., "Algorithms for Technology Mapping Based on Binary Decision Diagrams and on Boolean Operations", IEEE 1993, pp. 599–620.
Malik et al., "Logic Verification using Binary Decision Diagrams in a Logic Synthesis Environment", IEEE 1988, pp. 6–9.
Bennetts et al., "Partial Scan: What Problem does it Solve?" IEEE 1993, pp. 99–106.
Cheng et al., "A Partial Scan Method for Sequential Circuits with Feedback", IEEE 1990, pp. 544–548.
Chickermane et al., "An optimization Based Approach to the Partial Scan Design Problem", IEEE 1990, pp. 377–386.
Park et al., "An Efficient Method for Finding a Minimal Feedback ARC Set in Directed Graphs", IEEE 1992, pp. 1863–1866.

Park et al., "A Graph Theoretic Approach to Partial Scan Design by K–Cycle Elimination", IEEE 1992, pp. 303–311.
Smith et al., "The Identification of a Minimal Feedback Vertex Set of a Directed Graph", IEEE 1975, pp. 9–15.
Akers, "Binary Decision Diagrams", IEEE 1978, pp. 509–516.
Kwang–Ting Cheng et al., "An Economical Scan Design for Sequential Logic Test Generation", FTCA–19, pp. 1–8, Apr. 3, 1989.
D. H. Lee et al., "On Determining Scan Flip–Flops in Partial–Scan Designs", Proceedings of the Int'l Conf on Computer–Aided Design, pp. 322–325.
Proceedings of the Int'l Test Conference, pp. 303–311, Oct. 1992.
Vivek Chickermane et al., "An Optimization Based Approach to the Partial Scan Design Problem", Proceedings of Int'l Test Conference, pp. 377–386, Oct. 1990.
Vivek Chickermane et al., "A Fault Oriented Partial Scan Design Approach", Proceedings of the Int'l Conference on Computer–Aided Design, pp. 400–403, Nov. 1991.
George W. Smith et al., "Vertex Set of a Directed Graph", IEEE Transactions on Circuits and Systems, vol. CAS–22, p. 1, Jan. 1975.
Erwin Trischler, "Incomplete Scan Path with an Automatic Test Generation Methodology", 1980 IEEE Test Conference, Paper 7.1, pp. 153–162.

*Primary Examiner*—Kevin J. Teska
*Assistant Examiner*—Tan Nguyen
*Attorney, Agent, or Firm*—Philip J. Feig

[57] ABSTRACT

In partial scan testing of integrated circuits, for an arbitrary graph of an integrated circuit, a Boolean function is derived whose satisfying assignments directly correspond to feedback vertex sets of the graph. The Boolean function is then used for determining the minimum cost feedback vertex set. Boolean function representation using Binary Decision Diagrams (BDI)) in logic synthesis is used to solve the problem of representing the Boolean function efficiently, even for large graphs. The determined minimum cost feedback vertex set is used to select those memory elements in the integrated circuit comprising the scan chain.

26 Claims, 1 Drawing Sheet

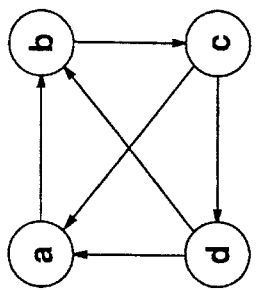
FIG. 1a
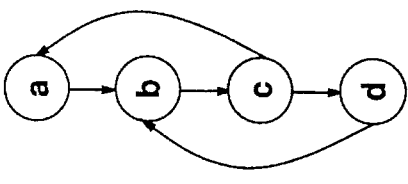
FIG. 1b
First Iteration:
$f(a) = 1.a = a$
$f(b) = (1+a).b = b$
$f(c) = b.c$
$f(d) = b.c.d$
Second Iteration:
$f(a) = b.c.a.$
$f(b) = (b.c.d + b.c.a).b = b.c.d + b.c.a$
$f(c) = (b.c.d + b.c.a) c = b.c.d + b.c.a$
$f(d) = (b.c.d + b.c.a).d = b.c.d$
FIG. 1c
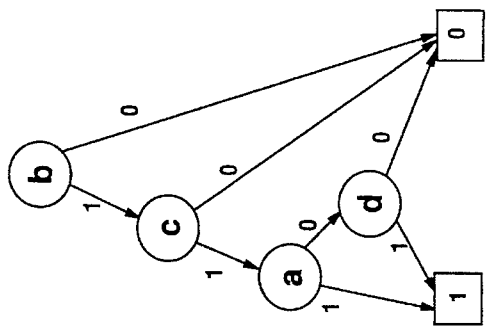
FIG. 2

METHOD OF FINDING MINIMUM-COST FEEDBACK-VERTEX SETS FOR A GRAPH FOR PARTIAL SCAN TESTING WITHOUT EXHAUSTIVE CYCLE ENUMERATION

BACKGROUND OF THE INVENTION

The present invention relates to partial scan testing of integrated circuits and specifically to a method of computing minimum-cost feedback-vertex sets for a graph of an integrated circuit for use in selecting memory elements for partial scan testing.

Partial scan testing of integrated circuits is becoming a more widespread method. The method provides comparable ease of testing as full scan testing at a fraction of the cost. The main issue when using partial scan testing is the selection of the proper memory elements, i.e. latches or flip-flops, comprising the scan chain.

Testing of sequential circuits is recognized as a key problem in the design and manufacture of integrated circuits. Unfortunately, it is a problem that has not yet been solved to the desired level of satisfaction. Scan insertion is a widely used design-for-testability approach to simplifying the test generation and test application problems for sequential circuits. Unfortunately, making a flip-flop scannable introduces area and performance penalties in the design. These penalties make scanning all flip-flops infeasible in a large number of situations. It has also been suggested in the prior art that an intelligent choice of a subset of flip-flops for scan insertion can lead to significant improvement in the testability of the design, thereby making it possible to realize the design-for-testability goal without significant area or performance penalties. This approach has come to be known as partial scan testing. Given a limited number of flip-flops available for scan insertion, the method used for flip-flop selection is of utmost importance in partial scan testing since it determines the testability of the final circuit. The present invention concerns a method for use in flip-flop selection.

Previous work in this regard has concentrated on applying the knowledge of circuit topology to flip-flop selection. It has been recognized in the prior art that the lengths of the input sequences required to test the faults are a direct measure of the testability of the circuit. In general, the longer the test sequences, the greater are the times required for test generation and test application. Feedback latches in sequential circuits are the primary reason for long test sequences. Recognizing that, a flip-flop selection method that operated by making the circuit maximally feedback free was proposed by Cheng and Agrawal in an article entitled "An Economical Scan Design for Sequential Logic Test Generation" in the Proceedings of the Fault Tolerant Computing Symposium", at pages 28 to 35, June 1989. The heuristic itself attempts to solve an NP-hard problem, i.e. computing the minimum-cost feedback-vertex set of a graph. Cheng and Agrawal proposed an approximation to the minimum-feedback vertex set problem in which flip-flops are selected based on the number of loops passing through them.

Since it was first proposed, loop breaking as a way of selecting flip-flops has become widely popular and several extensions to the approximate algorithm method of Cheng and Agrawal have been proposed. The teaching in an article by D. Lee and M. Reddy entitled "On Determining Scan Flip-Flops in Partial-Scan Designs" in the Proceedings of the International Conference on Computer-Aided Design, at pages 332–325 dated November 1990 and in an article by S. Park and S. Akers entitled "A Graph Theoretic Approach to Partial Scan Design by K-Cycle Elimination" in the Proceedings of the International Test Conference at pages 303 to 311 dated October 1992, was to improve the solution by first reducing the graph using techniques previously published in graph theory literature and then applying the approximate algorithm on the reduced graph. The teaching in an article by V. Chickermane and J. Patel entitled "An Optimization Based Approach to the Partial Scan Design Problem" in the Proceedings of the International Test Conference at pages 371 to 386 dated October 1990 and in an article by V. Chickermane and J. Patel entitled "A Fault Oriented Partial Scan Design Approach" in the Proceedings of the International Conference on Computer-Aided Design at pages 400 to 403 dated November 1991 was incorporating cost functions other than vertex cardinality into feedback vertex selection.

While the above approximations to the minimum feedback vertex set problem provide reasonably good results for the commonly available benchmarks, there are three problems associated with the approximations: how close to optimal the final solution is, is unclear; the enumeration of the potentially exponentially large number of cycles in the graph is involved; and optimization under any criterion other than the quantity of flip flops is not effective.

SUMMARY OF THE INVENTION

Scan design has been proposed as a solution for simplifying the test generation and test application problems for sequential circuits. In scan design, a flip-flop can operate in one of two modes. In the test mode, values can be loaded serially into the flip-flops from a source external to the chip. The flip-flop contents can be observed by serially shifting out the contents to an external pin. In the normal mode, flip-flops are accessed in parallel by switching circuitry inside the chip. Scan design serves to make the flip-flops completely controllable and observable in the rest mode, thereby effectively reducing the sequential-circuit testing problem to a combinational-circuit testing problem. Many variations of the basic scan design approach exist. Each variation is characterized by the flip-flop design and by the design rules enforced during chip design in order to ensure the applicability of scan design.

Special flip-flops have to be used in scan design to enable switching between parallel and serial access modes. These flip-flops are usually much larger than non-scan flip-flops. In addition, scan flip-flops introduce additional delays into the circuit. Therefore, incorporation of scan design introduces area and performance penalties in the design. The larger the number of flip-flops, the greater is the penalty associated with making all flip-flops scannable. Chips designed with tight area and delay constraints cannot afford to have all flip-flops made scannable. In addition, test application time is dominated by the time required to scan flip-flop contents in and out. The larger the quantity of flip-flops in the scan chain, the larger the test application time.

The method of making only a subset of flip-flops scannable is called partial scan, as described in an article by E. Trischler entitled "Incomplete Scan Design with an Automatic Test Generation Methodology" in the Proceedings of the International Test Conference, pages 153–162 dated November, 1980. With an intelligent choice of flip-flops to scan, partial scan can result in reduced area and performance penalties and a reduced test application time compared to complete scan, without sacrificing testability.

The present invention concerns a method of flip-flop or memory element selection.

In the present invention, there is disclosed a method for computing the minimum-cost feedback-vertex set for a graph, the result of which computation is used to select memory elements of an integrated circuit for partial scan testing. For an arbitrary graph, a Boolean function is derived, whose satisfying assignments directly correspond to feedback vertex sets of the graph. Cycles in the graph are never explicitly enumerated, but rather, are captured implicitly in this Boolean function. The Boolean function is then used for determining the minimum cost feedback vertex set. Boolean function representation using Binary Decision Diagrams (BDDs) in logic synthesis is used to solve the problem of representing the Boolean function efficiently even for large graphs. Once the Boolean function is obtained, determining the minimum-cost satisfying assignment is linear in the size of the representation.

An advantage of the present invention is that the complexity of the graph traversal required to build the Boolean function is polynomial in the size of the graph. The limitation in the present invention is the representation and manipulation of the Boolean function rather than the traversal of the graph. Even if the number of loops in the graph is exponential, it is frequently the case that the Boolean function representation will be polynomial in size in the number of vertices in the graph. This implies that it is frequently possible for the present method to find the optimum solutions for graphs which are intractable using the conventional approaches involving some form of explicit loop enumeration on the original graph.

The novelty of the present method lies in the fact that Boolean function representation and manipulation is used to efficiently solve a problem in graph theory. An existing exact algorithm for the minimum feedback vertex set problem is described in an article by G. Smith and R. Walford entitled "Vertex Set of a Directed Graph" in IEEE Transactions on Circuits and Systems, vol. CAS-22, at page 1, dated January 1975 and involves a branch-and-bound search on the original graph. The described algorithm reaches its practical limits even for moderate sized graphs. Thus, the present invention represents an important advance in the art of exact solutions for this problem.

Another important feature of the present method is its ability to easily handle cost functions other than vertex cardinality. In practice, from among all the solutions that break all loops, it is most desirable to select the solution which minimally perturbs the circuit. An example of such a perturbation is the effect of scanning a flip-flop on the delays of the paths passing through it. If each flip-flop is weighted by the degree of perturbation caused by making it scannable, the present method can easily determine the flip-flop selection which causes the absolute minimum perturbation.

In accordance with the teachings of the present invention, exact solutions result for most benchmark circuit graphs and approximate solutions based on an initial partitioning result for very large circuit graphs.

The minimum cost feedback vertex set problem is a general problem encountered in several Computer-Aided Design (CAD) applications. Thus, the present invention has practical applications in areas in addition to partial scan testing.

A principal object of the present invention is therefore, the provision of a method of selecting memory elements used for partial scan testing of an integrated circuit.

Another object of the present invention is the provision of a method of determining the minimum cost feedback vertex set for a graph describing an integrated circuit and selecting memory elements for partial scan testing of the integrated circuit based upon such determination.

A further object of the present invention is the derivation of a Boolean function whose satisfying assignments directly correspond to feedback vertex sets of a graph describing an integrated circuit and using the function to determine a minimum cost feedback vertex set and selecting memory elements for partial scan testing of the integrated circuit based upon such determination.

Further and still the objects of the present invention will become more clearly apparent when the following specification is read in conjunction with the accompanying drawings.

BRIEF DESCRIPTION OF THE DRAWING

FIG. 1a is a schematic representation of a graph;

FIG. 1b is a schematic representation of the graph of FIG. 1a reflecting back edges and the topological ordering imposed of the depth first search;

FIG. 1c shows the values of the logic functions after the first and second iteration of the method; and FIG. 2 is a binary decision diagram of the graph shown in FIG. 1a.

DETAILED DESCRIPTION

In accordance with the teachings of the present invention, a method is disclosed for computing the minimum-cost FVS (Feedback Vertex Sets) that is exact but is still practical for large graphs. A basic principle of the method is to avoid the explicit enumeration of cycles. This is accomplished by constructing in polynomial time a Boolean formula, $f(G)$, for a graph G, whose satisfying assignments are in one to one correspondence with feedback vertex sets of G. The construction of the Boolean formula implicitly accounts for all cycles in the graph. The size of the Boolean representation will not necessarily always be polynomial in the size of G. However, recently developed efficient Boolean representation/manipulation techniques for use in logic synthesis are employed to make this problem tractable. Using the representation described below for $f(G)$, the minimum-cost FVS can be obtained in time linear in the size of the representation.

The present invention is best understood by referring to the figures and specifically to FIG. 1a which is a graphical representation of a simple example illustrating the method. A logic variable is associated with each vertex in the graph. In addition with each vertex, u, a logic function, $f(u)$, is stored which is computed iteratively. The first step of the method is a depth first search of G, as described in the following dfs_initialize (G) algorithm:

```
dfs_initialize(G)
{
    foreach vertex u IN V {
        status[u] = unvisited;
        function(u) = 0;
    }
    foreach vertex u IN V {
        if(status[u] == unvisited) dfs_initialize_visit(u);
    }
{
dfs_initialize_visit(u)
{
    status[u] = visiting;
    foreach edge(u,v,){
```

-continued

```
        if(status[u] == unvisited) dfs_initialize_visit(v);
        if(status[u] == visiting){  /* back edge found */
            add_to_set(B, u);
            function(u) = 1;
        }
    {
    status[u] = visited;
{
```

The results of the depth first search shows the existence of two back edges, i.e. edges that would result in cycles, in the graph. The graph is redrawn in FIG. 1b to reflect the back edges and the topological ordering imposed by the depth first search. In FIG. 1c vertices c and d are added to the set B which contains all vertices from which there are back edges. Removing all vertices in B will remove all cycles in the graph, however this solution is sub-optimal in general, otherwise the problem would not be NP-hard. As part of this initialization, assign $f(c)=1$ and $f(d)=1$, i.e. the logic functions for all vertices in the set B are the constant 1 function. With this initialization accomplished, the next step is an iterative pass of the graph as shown in following compute (G,B) algorithm;

```
compute(G, B)
{
    for i = 1 to |B| do{
        foreach vertex v IN V {
            status = unvisited;
        }
        foreach vertex v IN B {
            compute_step(v);
        }
    }
    f = 0;
    foreach vertex v IN B {
        f = f + f(v);
    }
}
```

The new values for the logic functions for the vertices in B are computed using the old values. This computation is done in a reverse depth first order starting from the vertices in B as shown in the following recursive algorithm compute_ step (v):

```
compute_step(v)
{
    v.status = visiting;
    g = 0;
    foreach edge(u, v){
        if(status[u] == unvisited) compute_step(u);
        g = g + f(u);
    }
    f(v) = v * g;
    status = visited;
}
```

Thus the logic function for a vertex, v, is computed only after all the logic functions for all vertices u, (u, v) ∈E, have been computed. The logic function at a vertex v is computed as:

$$f(v)=v \cap (\cup_{(u,v)\in E} f(u))$$

$f(v)$ is used to implicitly store all paths that pass though v. The equation above expresses the fact that the set of paths through a vertex are those that pass through some in-edge of this vertex followed by this vertex. FIG. 1c shows the values of the logic functions after the first iteration. Since the longest simple path can possibly go through all of the vertices in B, k iterations are required to check all such paths, where k is the number of elements in B. This is shown in algorithm compute(G,B) above. In practice, not all k iterations may be needed and the algorithm can be terminated as soon as a fixed point is reached. After at most k iterations, the functions at the k vertices of B capture information about all cycles in the circuit. Let $f$ be the union (logical OR) of these functions. Assuming no simplification of any formulas is performed, then $f$ is computed in time proportional to $k.(|V|+|E|)$. Since k is bounded by $|V|$, the complexity of generating $f$ is $O(|V|.(|V|+|E|))$. In practice it is closer to $O(|E|)$.

$f$ is positively unate (or monotone increasing) in all its variables, i.e. increasing the value of any of its variables (changing them from 0 to 1) can only increase the value of the function (cause a 0 to a 1 change) and cannot decrease the value (cause a 1 to 0 change). The uncomplemented variables in each satisfying assignment to $f$ correspond to a cycle in G. In the example of FIG. 1a, $f$=bcd+bca. This directly provides bcd and bca, the two fundamental cycles (those not contained in any other cycle). If $f$ was written in a sum-of-products notation, all the fundamental cycles would be enumerated. Even though that is more manageable than the set of all cycles, it is something to be avoided.

BDDs (Binary Decision Diagrams) provide an alternative representation for logic functions that in practice is more compact than the sum-of-product representation. This is the preferred representation used in practicing the present invention.

The BDD for the function $f$ for the above example is shown in FIG. 2. A BDD has two terminal vertices denoting the constant functions 1 and 0. Each non-terminal vertex is labeled with a variable, and has two branches. The 1 (0) branch points to the function to be evaluated when the value of the variable is 1 (0). Evaluation of the function for any given assignment of inputs proceeds by walking down the BDD and taking the branch corresponding to the value of the variable at each vertex. The terminal vertex reached is the value of the function for that particular assignment.

The complement of $f$, denoted by $\bar{f}$ is the function that is of most interest. The complemented variables in each satisfying assignment to $\bar{f}$ correspond to a feedback vertex set for the graph. The reason for this result is that, each satisfying assignment for $\bar{f}$ contains at least one complemented variable for each satisfying assignment of $f$. Thus, each satisfying assignment for $\bar{f}$ contains at least one vertex from each cycle of G. For instance, in the example shown in FIGS. 1a and 2, $\bar{b}$ is a satisfying assignment for $\bar{f}$, indicating that removal of b will break all cycles in the graph. Note that the BDD for $\bar{f}$ can be directly obtained from that of $f$ by just switching the roles of the 0 and 1 terminal vertex.

In general there will be several satisfying assignments and hence several feedback vertex sets, the present invention is used to directly determine the feedback vertex sets with the least cost. This is easily accomplished for most cost functions with the BDD representation. All BDD vertices are assigned a negative cost to indicate that the cost has not been computed yet. A cost of ∞ is assigned to the 0 terminal vertex, i.e., there is no satisfying assignment for the 0 terminal vertex. A cost of 1 is assigned to the 1 terminal vertex. With this initial assignment the following min_ cost(f) algorithm shows how the minimum cost assignment can be obtained for an additive cost function.

```
min_cost(f)
{
  if(f.cost > 0)
     return f.cost;/* already computed */
  if(f == 1) {
     f.cost = 1;
     f.assignment = { };
     return f.cost;
  }
  if(f == 0){
     f.cost = ∞;
     f.assignment = { };
     return f.cost;
  }
  if(min_cost(f->1branch) < min_cost(f->0branch) +
  cost(f.variable){
     f.cost = f->1branch.cost;
     f.assignment = f->1branch.assignment;
  } else {
     f.cost = f->0branch.cost + cost(f.variable);
     f.assignment = f->0branch.assignment  f.variable;
  }
  return f.cost;
}
```

Here f.variable indicates the variable at the root of $f$, f.cost indicates the minimum cost satisfying assignment for $f$, and f.assignment provides the minimum cost satisfying assignment. The cost(variable) is the cost of including this variable in the satisfying assignment. The resulting logic function in consideration is a monotonically decreasing (negatively unate) function in all its variables. Thus, none of the variables needs to be assigned to 1. This algorithm is linear in the size of the BDD since each edge is traversed exactly once.

The above described method differs from and is more efficient than known branch and bound algorithms. While both the present method and the branch and bound method branch at each internal BDD vertex representing the two way decision being made at a branch and bound time, the significant difference resides in the fact that the branch and bound decision structure is a tree while the BDD is a directed acyclic graph. The acyclic graph provides efficiency due to the automatic sharing of parts of the decision structure that are the same. Such efficiency is very difficult to achieve in a decision tree since it is difficult to recognize what parts of a tree have been already visited. It is this aspect of BDDs that makes them advantageous for solving Boolean function satisfiability as compared to other decision tree algorithms. Such use of BDDs to solve partial scan related problems has not been done heretofore.

Various heuristic approaches follow from the basic method described above for circuits for which the minimum cardinality solution cannot be computed. Several examples are described below.

If the original graph is too large for achieving a definite solution, flip-flops should be selected until the circuit has been partitioned so that the largest strongly connected component is of manageable size. Heuristics are used to select flip-flops that reduce the sizes of the strongly connected components without breaking the graph into a large number of very small strongly connected components. Selecting a flip-flop which is pre, sent in a large number of loops is not necessarily a good heuristic in this regard.

Another heuristic which follows from the exact algorithm is the following: the Boolean OR of the expressions at the back edge nodes always encapsulates sufficient information to find a (possibly suboptimal) solution to the feedback vertex problem. If memory limits are reached at any time, it is possible either to select the minimum cardinality complete solution from the expressions computed up to that time, or iternatively to select a part of the solution and proceed from that point. Both of these heuristics are likely to introduce sub-optimality in the final solution. In the second alternative it is possible to select a partial solution of a certain cardinality which occurs in the largest number of solutions from among the solutions at that time.

In order to demonstrate the applicability of the method for practical application in flip-flop selection for partial scan testing of integrated circuits, the method was applied to the circuits in the ISCAS 89 benchmark set. See, the article by F. Brglez et al entitled "Combinational Profiles of Sequential Benchmark Circuits" in the Proceedings of the International Symposium on Circuits and Systems" at Portland, Oreg. in May 1989. The largest examples in this set have more than 1500 flip-flops, making them a good test. Some of the circuits in the ISCAS 89 benchmark set are small enough that the method solves them trivially and hence, are not included in the results. The results shown are for the larger examples for circuits with more than 20 flip-flops from the benchmark set. In addition, from among the larger examples, results are shown only for those examples for which the current method is able to find the minimum-cost feedback-vertex set. In particular, results are not reported for s38584 and s15850 since the optimum solutions for these two circuits were not obtained. The statistics of the examples are provided in Table 1. The column headed #I is the quantity of primary inputs, #O is the quantity of primary outputs, #G is the quantity of gates, and #L is the quantity of flip-flops in the circuit.

TABLE 1

| CKT | #I | #O | #G | #L |
| --- | --- | --- | --- | --- |
| s13207 | 31 | 121 | 7875 | 669 |
| s1423 | 17 | 5 | 635 | 74 |
| s35932 | 35 | 320 | 15998 | 1728 |
| s38417 | 28 | 106 | 22263 | 1636 |
| s5378 | 35 | 49 | 2195 | 164 |
| s838 | 35 | 2 | 390 | 32 |
| s9234 | 19 | 22 | 5556 | 228 |
| s953 | 16 | 23 | 395 | 29 |

The results provided in Table 2, show that for a small expenditure in CPU time, it is possible to compute the minimum or close to the minimum quantity of flip-flops that must be selected to break all loops. For some examples, additional techniques were incorporated to compute the solutions. The significance is that all previous algorithms for loop breaking have been heuristic in nature and cannot provide feedback regarding the proximity of their solution to the optimum. Given the penalties associated with scanning flip-flops, the present invention provides a level of confidence that flip-flops are not being wastefully scanned. Such information is extremely useful in the design environment.

TABLE 2

| | | Implicit Approach | |
| --- | --- | --- | --- |
| CKT | Heuristic Loop Cutting #FF | #FF | CPU Time (sec) |
| --- | --- | --- | --- |
| s13207 | 59 | 59 | 31 |
| s1423 | 22 | 21 | 3469 |
| s35932 | 306 | 306 | 91 |
| s38417 | 374 | 374 | 306 |
| s5378 | 30 | 30 | 8 |
| s838 | 0 | 0 | 1 |
| s9234 | 53 | 53 | 1770 |

TABLE 2-continued

| | Heuristic Loop Cutting | Implicit Approach | |
|---|---|---|---|
| CKT | #FF | #FF | CPU Time (sec) |
| s953 | 5 | 5 | 1.5 |

In Table 2, the column labelled Heuristic Loop Cutting corresponds to the application of the heuristic loop breaking algorithm proposed by Lee and Reddy supra. The column labelled Implicit Approach corresponds to the application of the present invention. The column labelled #FF corresponds to the cardinality of the solution obtained, and the column labelled CPU Time refers to the time required to compute the solution.

An important aspect of the present invention resides in the fact that it enables the enumeration of all minimum cardinality solutions to the loop-breaking problem. The advantages provided are as follows. It is well known that the relative cost of scanning a flip-flop depends on various factors. For example, since scanning a flip-flop adds delay to paths going through it, if there is a choice between selecting two flip-flops, it is preferable to select the flip-flop with shorter paths through it. Given a circuit with relative costs associated with the flip-flops, the present invention automatically selects the minimum weighted-cost solution from all the possible solutions. The data provided in Table 2 is for the special case of all flip-flops being assigned equal costs. The assignment of unequal costs does not add complexity to the selection problem.

In order to illustrate the possibilities when multiple solutions can be enumerated, all the minimum cardinality solutions were explicitly enumerated for s1423 and measured the fault coverage for the partial-scan circuit corresponding to each solution. The data is provided in Table 3.

TABLE 3

| CKT | Fault Cov. (%) | TPG Time (sec) | Num Vectors |
|---|---|---|---|
| Minimum Soln 1 (21 ff selected) | 87.3 | 201 | 3373 |
| Minimum Soln 2 (21 ff selected) | 86.0 | 167 | 2313 |
| Minimum Soln 3 (21 ff selected) | 81.9 | 186 | 3033 |
| Minimum Soln 4 (21 ff selected) | 84.6 | 187 | 2771 |
| Minimum Soln 5 (21 ff selected) | 81.0 | 123 | 4776 |
| Minimum Soln 6 (21 ff selected) | 86.4 | 192 | 2961 |
| Minimum Soln 7 (21 ff selected) | 85.1 | 192 | 2914 |
| Minimum Soln 8 (21 ff selected) | 86.1 | 158 | 3214 |
| Minimum Soln 9 (21 ff selected) | 81.8 | 177 | 2720 |
| Minimum Soln 10 (21 ff selected) | 77.9 | 174 | 2294 |
| Minimum Soln 11 (21 ff selected) | 85.6 | 165 | 1996 |
| Minimum Soln 12 (21 ff selected) | 86.5 | 178 | 3000 |
| Heuristic Soln (27 ff selected) | 86.1 | 138 | 2158 |

Not all solutions are identical in terms of fault coverage, even though each solution results in a partial scan circuit without loops. Given that all solutions are available it is possible to select the solution that provides the best fault coverage (87%). In the table, the rows Soln 1–12 correspond to the solution obtained using the present invention, and the row Heuristic Soln corresponds to the solution obtained using the heuristic algorithm of Cheng and Agrawal. As can be seen, the best fault coverage for the minimum cardinality solution is 87% while the fault coverage for the heuristic solution is 86%. This is so even though more flip-flops are selected in the heuristic solution.

While there have been described and illustrated a preferred method of selecting memory elements in an integrated circuit for use in partial scan testing of an integrated circuit, it will be apparent to those skilled in the art that variations and modifications are possible without deviating from the broad spirit and teachings of the present invention which shall be limited solely by the scope of the claims appended hereto.

What is claimed is:

1. A method of selecting memory elements in an integrated circuit for partial scan testing comprising the steps of:
   deriving a graph from the integrated circuit in which the vertices are memory elements in the integrated circuit and there is a directed edge between vertices if there is a path in the integrated circuit from a memory element corresponding to a source vertex to a memory element corresponding to a sink vertex;
   associating a Boolean variable with each vertex in the graph;
   deriving a Boolean function whose satisfying assignments correspond to feedback vertex sets of the graph without explicitly enumerating each cycle in the graph;
   determining which of the vertex sets is a minimum cost feedback vertex set by finding a minimum cost satisfying assignment for the Boolean function; and
   selecting memory elements corresponding to the vertices in the minimum cost feedback vertex set for partial scan testing of the integrated circuit.

2. A method as set forth in claim 1, wherein said deriving a Boolean function comprises performing a depth first search to determine back edges to define a feedback vertex set of the graph.

3. A method as set forth in claim 2, further comprising performing iterative passes of the graph, where each iterative pass comprises the step of determining a Boolean function according to the algorithm Compute (G,B).

4. A method as set forth in claim 1, wherein said minimum cost feedback vertex set is the minimum vertex cardinality obtained as the minimum satisfying assignment for the Boolean function.

5. A method as set forth in claim 1, wherein said minimum cost feedback vertex set is the minimum delay promulgation.

6. A method as set forth in claim 1, wherein said Boolean function is represented by a binary decision diagram.

7. A method as set forth in claim 6, wherein said deriving a Boolean function comprises performing a depth first search to determine back edges to define a feedback vertex set of the graph.

8. A method as set forth in claim 7, further comprising performing iterative passes of the graph, where each iterative pass comprises the step of determining a Boolean function according to the algorithm Compute (G,B).

9. A method as set forth in claim 6, wherein said minimum cost vertex set is the minimum vertex cardinality obtained as the minimum satisfying assignment for the Boolean function.

10. A method as set forth in claim 6, wherein said minimum cost feedback vertex set is the minimum delay promulgation.

11. A method of determining a minimum cost feedback vertex set of a graph comprising the steps of:
   associating a Boolean variable with each vertex in the graph;
   deriving a Boolean function whose satisfying assignments correspond to feedback vertex sets of the graph without explicitly enumerating each cycle in the graph;
   determining which of the vertex sets is a minimum cost feedback vertex set by finding a minimum cost satisfying assignment for the Boolean functions; and selecting the minimum cost feedback vertex set for the design application.

12. A method as set forth in claim 11, wherein said deriving a Boolean function comprises performing a depth first search to determine back edges to define a feedback vertex set of the graph.

13. A method as set forth in claim 12, further comprising performing iterative passes of the graph, where each iterative pass comprises the step of determining a Boolean function according to the algorithm compute (G,B).

14. A method as set forth in claim 11, wherein said minimum cost feedback vertex set is the minimum vertex cardinality obtained as the minimum satisfying assignment for the Boolean function.

15. A method as set forth in claim 11, wherein said minimum cost feedback vertex set is the minimum delay promulgation.

16. A method as set forth in claim 11, wherein said Boolean function is represented by a binary decision diagram.

17. A method as set forth in claim 16, wherein said deriving a Boolean function comprises performing a depth first search to determine back edges to define a feedback vertex set of the graph.

18. A method as set forth in claim 17, further comprising performing iterative passes of the graph, where each iterative pass comprises the step of determining a Boolean function according to the algorithm compute (G,B).

19. A method as set forth in claim 16, wherein said minimum cost feedback vertex set is the minimum vertex cardinality obtained as the minimum satisfying assignment for the Boolean function.

20. A method as set forth in claim 16, wherein said minimum cost feedback vertex set is the minimum delay promulgation.

21. A method of selecting memory elements in an integrated circuit for partial scan testing comprising the steps of:

deriving a graph from the integrated circuit in which the vertices are memory elements in the integrated circuit and there is a directed edge between vertices if there is a path in the integrated circuit from a memory element corresponding to a source vertex to a memory element corresponding to a sink vertex;

associating a Boolean variable with each vertex in the graph;

deriving a Boolean function whose satisfying assignments correspond to feedback vertex sets of the graph without explicitly enumerating each cycle in the graph;

determining vertex sets which are minimum cost feedback vertex sets by finding a minimum cost satisfying assignment for the Boolean functions; and selecting memory elements contained in a chosen one of said minimum cost feedback vertex sets for partial scan testing of the integrated circuit.

22. A method as set forth in claim 21, wherein said minimum cost feedback vertex set is the minimum vertex cardinality set obtained as the minimum satisfying assignment for the Boolean function.

23. A method as set forth in claim 21, wherein said minimum cost feedback vertex set is chosen as the minimum delay promulgation set.

24. A method as set forth in claim 21, wherein said Boolean function is represented by a binary decision diagram.

25. A method as set forth in claim 24, wherein said minimum cost feedback vertex set is chosen as the minimum vertex cardinality set obtained as the minimum satisfying assignment for the Boolean function.

26. A method as set forth in claim 24, wherein said minimum cost feedback vertex set is chosen as the minimum promulgation set.

* * * * *

UNITED STATES PATENT AND TRADEMARK OFFICE
CERTIFICATE OF CORRECTION

PATENT NO. : 5,522,063
DATED      : May 28, 1996
INVENTOR(S) : Pranav N. Ashar and Sharad Malik It is certified that error appears in the above-indentified patent and that said Letters Patent is hereby corrected as shown below:

On title page, item [73]

Add as an assignee - - Princeton University, Princeton, New Jersey - -

Signed and Sealed this

Fifth Day of November, 1996

*Attest:*

BRUCE LEHMAN

*Attesting Officer*         *Commissioner of Patents and Trademarks*